United States Patent
Park

(10) Patent No.: US 10,002,676 B2
(45) Date of Patent: Jun. 19, 2018

(54) NONVOLATILE MEMORY DEVICE DETECTING DEFECTIVE BIT LINE AT HIGH SPEED AND TEST SYSTEM THEREOF

(71) Applicant: SAMSUNG ELECTRONICS CO., LTD., Suwon-si, Gyeonggi-do (KR)

(72) Inventor: Sang-In Park, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days. days.

(21) Appl. No.: 15/222,244

(22) Filed: Jul. 28, 2016

(65) Prior Publication Data

US 2017/0032849 A1    Feb. 2, 2017

(30) Foreign Application Priority Data

Jul. 30, 2015    (KR) .................... 10-2015-0108180

(51) Int. Cl.

| | |
|---|---|
| *G11C 29/04* | (2006.01) |
| *G11C 29/44* | (2006.01) |
| *G11C 29/26* | (2006.01) |
| *G11C 29/02* | (2006.01) |
| *G11C 29/40* | (2006.01) |
| *G11C 29/00* | (2006.01) |
| *G11C 16/04* | (2006.01) |
| *G11C 29/12* | (2006.01) |

(52) U.S. Cl.
CPC ............ *G11C 29/26* (2013.01); *G11C 29/025* (2013.01); *G11C 29/40* (2013.01); *G11C 29/78* (2013.01); *G11C 16/0483* (2013.01); *G11C 29/44* (2013.01); *G11C 2029/1204* (2013.01); *G11C 2029/4402* (2013.01)

(58) Field of Classification Search
CPC ....... G11C 29/26; G11C 29/025; G11C 29/40; G11C 29/78; G11C 16/0483; G11C 2029/1204
USPC ........................................ 365/185.09, 185.17
See application file for complete search history.

(56) References Cited

U.S. PATENT DOCUMENTS

| | | | | |
|---|---|---|---|---|
| 5,216,633 A | * | 6/1993 | Weon ...................... | G06F 21/79 340/5.65 |
| 5,347,484 A | * | 9/1994 | Kwong ................ | G11C 29/808 365/200 |
| 5,438,546 A | * | 8/1995 | Ishac .................... | G11C 29/846 365/189.02 |
| 6,477,074 B2 | | 11/2002 | Kikutake et al. | |

(Continued)

FOREIGN PATENT DOCUMENTS

| | | |
|---|---|---|
| KR | 10-2001-0059024 A | 7/2001 |
| KR | 10-2005-0058224 A | 6/2005 |

(Continued)

*Primary Examiner* — Ly D Pham
(74) *Attorney, Agent, or Firm* — Lee & Morse, P.C.

(57) ABSTRACT

A nonvolatile memory device includes a memory cell array, a page buffer connected to bit lines of the memory cell array, a defect detector, and an input/output circuit. The defect detector receives readout data from the page buffer through the bit lines and performs a logical operation based on the readout data for a plurality of column units. The defect detector outputs defective data based on the logical operation. The input/output circuit outputs the defective data based on a control signal.

15 Claims, 7 Drawing Sheets

(56) References Cited

U.S. PATENT DOCUMENTS

| | | | |
|---|---|---|---|
| 7,296,128 B2* | 11/2007 | Lee | G06F 11/1068 711/165 |
| 7,468,922 B2 | 12/2008 | Callaway et al. | |
| 7,657,802 B2 | 2/2010 | Naso | |
| 7,679,133 B2 | 3/2010 | Son et al. | |
| 8,081,529 B2 | 12/2011 | Pyeon | |
| 8,391,083 B2 | 3/2013 | Tajima et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 9,007,856 B2* | 4/2015 | Son | G11C 29/806 365/185.09 |
| 9,348,694 B1* | 5/2016 | Nassie | G06F 11/1068 |
| 2001/0056557 A1* | 12/2001 | Kawagoe | G11C 29/72 714/723 |
| 2004/0042284 A1* | 3/2004 | Sato | G11C 7/22 365/200 |
| 2004/0190357 A1* | 9/2004 | Scheuerlein | G11C 7/1006 365/222 |
| 2004/0202034 A1* | 10/2004 | Lee | G06F 11/1068 365/202 |
| 2005/0128830 A1 | 6/2005 | Nishihara et al. | |
| 2005/0257107 A1 | 11/2005 | Kim | |
| 2005/0270841 A1* | 12/2005 | Merritt | G11C 29/81 365/185.09 |
| 2006/0053361 A1* | 3/2006 | Kim | G11C 29/42 714/766 |
| 2006/0156180 A1* | 7/2006 | Kang | G11B 20/1803 714/758 |
| 2006/0171202 A1* | 8/2006 | Kawamoto | G11C 16/0483 365/185.17 |
| 2006/0184848 A1* | 8/2006 | Serizawa | G01R 31/31856 714/727 |
| 2008/0089153 A1 | 4/2008 | Byun et al. | |
| 2010/0020609 A1* | 1/2010 | Han | G11C 29/846 365/185.09 |
| 2011/0141817 A1* | 6/2011 | Takagiwa | G11C 11/5628 365/185.22 |
| 2011/0233648 A1 | 9/2011 | Seol et al. | |
| 2012/0159281 A1* | 6/2012 | Shalvi | G06F 11/1044 714/755 |
| 2012/0246507 A1 | 9/2012 | Luo et al. | |
| 2013/0010548 A1* | 1/2013 | Aritome | G11C 16/10 365/189.011 |
| 2013/0088919 A1* | 4/2013 | Kim | G11C 16/26 365/185.12 |
| 2013/0314992 A1* | 11/2013 | Takagiwa | G11C 29/04 365/185.09 |
| 2014/0029363 A1* | 1/2014 | Lim | G11C 15/046 365/200 |
| 2014/0169092 A1* | 6/2014 | Miyamoto | G11C 16/26 365/185.09 |
| 2015/0261613 A1* | 9/2015 | Tuers | G06F 9/4401 713/2 |
| 2015/0348633 A1* | 12/2015 | Song | G11C 16/12 365/185.19 |

FOREIGN PATENT DOCUMENTS

| | | |
|---|---|---|
| KR | 10-2005-0108106 A | 11/2005 |
| KR | 10-2008-0034308 A | 4/2008 |

* cited by examiner

NONVOLATILE MEMORY DEVICE DETECTING DEFECTIVE BIT LINE AT HIGH SPEED AND TEST SYSTEM THEREOF

CROSS-REFERENCE TO RELATED APPLICATION

Korean Patent Application No. 10-2015-0108180, filed on Jul. 30, 2015, and entitled, "Nonvolatile Memory Device Detecting Defective Bit Line at High Speed and Test System Thereof," is incorporated by reference herein in its entirety.

BACKGROUND

1. Field

One or more embodiments described herein relate to a nonvolatile memory device for detecting a defective bit line at high speed and a test system thereof.

2. Description of the Related Art

A semiconductor memory device is capable of storing data and reading out the stored data when necessary. A semiconductor memory device may be classified into a volatile memory device and a nonvolatile memory device. A volatile memory device loses its stored data when its power supply is interrupted. A nonvolatile memory device retains its stored data even when its power supply is interrupted. A flash memory device is a typical nonvolatile memory device.

A nonvolatile memory device includes memory cells to store data and the memory cells are located at the intersections of word lines and bit lines. In the case that defects occur at a specific bit line during a process, if the defective bit line is not replaced with a redundancy bit line, the whole nonvolatile memory device may become unusable or unavailable due to some defective bit lines.

Thus, in a wafer process, a nonvolatile memory device goes through a test operation for replacing the defective bit line. Generally, the test operation is performed by test equipment. The test operation programs specific data in memory cells, reads the programmed data and then compares logical states of the programmed data and the data actually read out to judge whether a defective bit line exists. Thus, data read out by an individual bit line unit has to be transmitted to the test device. That is, data transmission processes as much as the number of all bit lines in a memory cell array are needed to detect a defective bit line. However, the test device, in the case of replacing a defective bit line with a redundancy bit line, performs a replacement operation by a unit of a preset number of bit lines. That is, even in the case that a defect exists in only one bit line, a plurality of bit lines including the defective bit line is replaced.

That is, since a read operation for detecting a defect of a bit line and a replacement operation of a defective bit line of the test device are performed by different units respectively, a test operation is performed unnecessarily for a long period of time.

SUMMARY

In accordance with one or more embodiments, a nonvolatile memory device includes a memory cell array; a page buffer connected to bit lines of the memory cell array; a defect detector to receive readout data from the page buffer through the bit lines and to perform a logical operation based on the readout data for a plurality of column units, the defect detector to output defective data based on the logical operation; and an input/output circuit to output the defective data based on a control signal. The readout data may be test data to be provided to detect a defective bit line.

The defect detector may include a plurality of comparators, and each of the comparators may compare logical states of the readout data from the page buffer and output first data when at least one of the logical states of the readout data is different and output second data when all of the logical states of the readout data are the same, the first data corresponding to defective data. The first data may indicate that at least one of bit lines transmitting readout data to a corresponding one of the comparators that output the data is the defective bit line. The second data may represent that bit lines transmitting readout data to a corresponding one of the comparators all non-defective bit lines.

The plurality of column units may be column units by which a defective bit line is repaired in a test operation of the nonvolatile memory device. The memory cell array may include a three-dimensional memory cell array.

In accordance with one or more other embodiments, a test system includes a nonvolatile memory device including: defect detector to receive readout data from a page buffer connected to bit lines of a memory cell array through the bit lines and to perform a logical operation based on the readout data for a plurality of column units, the defect detector to output defective data for the column units, and an input/output circuit to output the defective data based on a read enable signal; and a test device to receive the defective data from the nonvolatile memory device, detect one or more defective bit lines based on the defective data, and perform a repair operation which includes replacing the one or more defective bit lines with redundancy bit lines.

The defect detector may include a plurality of comparators, and each of the comparators may compare logical states of the readout data from the page buffer and to output first data when any one of the logical states is different and to output second data when the logical states are the same, the first data corresponding to the defective data. The first data may represent that at least one of bit lines transmitting readout data to a corresponding one of the comparators that output the data is a defective bit line. The test device may replace all bit lines that transmitted readout data to the corresponding one of the comparators with redundancy bit lines based on the first data.

The second data may indicate that bit lines transmitting readout data to a corresponding one of the comparators that output the second data are non-defective bit lines. The plurality of column units may be column units by which the test device repairs defective bit lines of the nonvolatile memory device.

The memory cell array may be a three-dimensional memory cell array, and the three-dimensional memory cell array may have one or more physical levels of memory cells with active regions monolithically provided on a silicon substrate. The readout data may be provided to detect the one or more defective bit lines.

In accordance with one or more embodiments, an apparatus includes a defect detector connected to receive readout data from a buffer through a plurality of bit lines and to perform a logical operation based on the readout data, the defect detector to output defective data based on the logical operation, the defective data indicating that at least one of the bit lines is defective; and an output circuit connected to the defect detector, the output circuit to output the defective data. The logical operation may be an OR operation.

The apparatus may include a tester to perform a repair operation, where the repair operation may include replacing a group of the bit lines with an equal number of replacement bit lines, the group of bits lines including the at least one defective bit line and one or more other ones of the bit lines that are not defective. The defect detector may output first data when logical states of the readout data are different, second data when the logical states of the readout data are the same, and the first data corresponds to the defective data.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
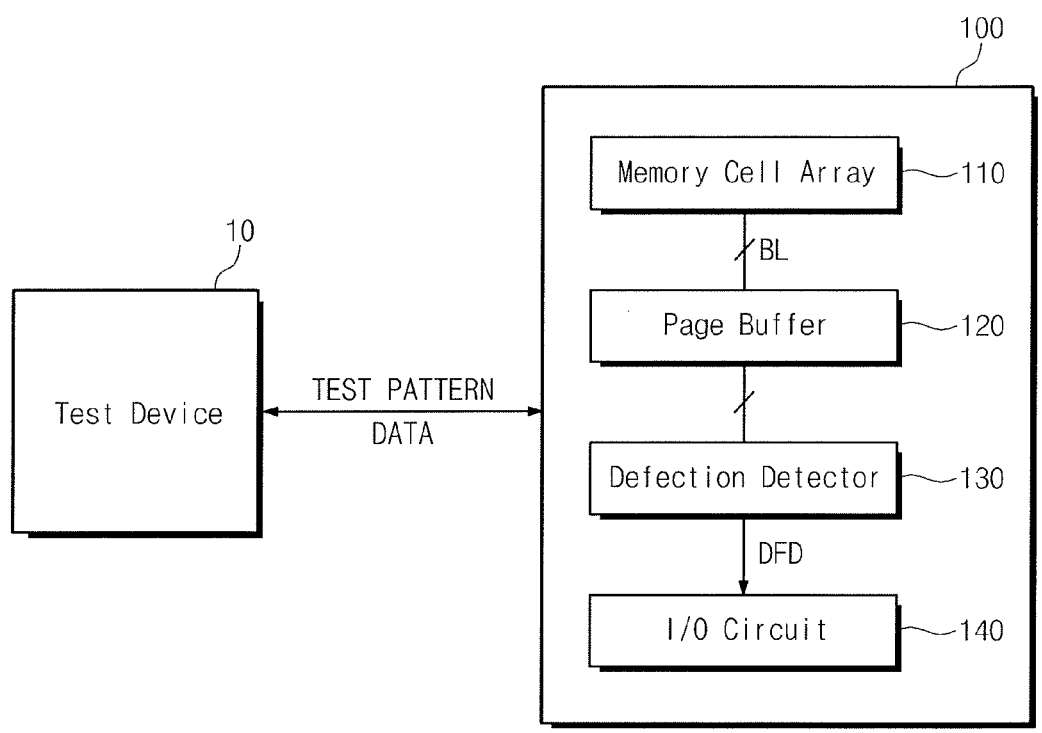
FIG. 1 illustrates an embodiment of a test device for a nonvolatile memory device.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

In the drawings, the dimensions of layers and regions may be exaggerated for clarity of illustration. It will also be understood that when a layer or element is referred to as being "on" another layer or substrate, it may be directly on the other layer or substrate, or intervening layers may also be present. Further, it will be understood that when a layer is referred to as being "under" another layer, it may be directly under, and one or more intervening layers may also be present. In addition, it will also be understood that when a layer is referred to as being "between" two layers, it may be the only layer between the two layers, or one or more intervening layers may also be present. Like reference numerals refer to like elements throughout.

The nonvolatile memory device corresponding to the embodiments described herein may correspond to, for example, to a flash memory device, a FRAM, a MRAM, a ReRAM, a FRAM, a NOR flash memory, or another kind of memory device.

FIG. 1 illustrates an embodiment of a test device 10 for performing a test operation for a nonvolatile memory device 100. The test operation may include, for example, a repair operation to detect defective bit lines of a memory cell array 110 in the nonvolatile memory device 100 and for replacing the detected defective bit lines with one or more redundancy bit lines.

The test device 10 may control a test operation for detecting defective bit lines included in the memory cell array 110 of the nonvolatile memory device 100. The test device 10 may also perform or control a repair operation with respect to the detected defective bit lines. The test device 10 may include a built-in self test (BIST) circuit for testing the memory cell array 110 and a built-in self repair (BISR) circuit for performing a self repair operation based on a test result by the BIST circuit.

The test device 10 may perform a test operation with respect to the memory cell array 110 based on a test pattern. If the test device 10 provides a set test pattern to the nonvolatile memory device 100, the nonvolatile memory device 100 may program memory cells of the memory cell array 110 based on the test pattern. For example, the nonvolatile memory device 100 may program all memory cells of the memory cell array 110 to logic 0 based on the test pattern. The nonvolatile memory device 100 may program all memory cells of the memory cell array 110 to logic 1 based on the test pattern. The nonvolatile memory device 100 may also program all memory cells of the memory cell array 110 alternately to logic 0 and logic 1 based on the test pattern.

The test device 10 may read data programmed in memory cells of the nonvolatile memory device 100 and control the nonvolatile memory device 100 to transmit the readout data to the test device 10. The test device 10 may compare the transmitted readout data with data programmed in the nonvolatile memory device 100 to detect a defective bit line. For example, in case that the readout data and the programmed data have different logical states respectively, a corresponding bit line may be judged to be a defective bit line.

The test device 10 may control the nonvolatile memory device 100 to replace the detected defective bit line with a redundancy bit line. The test device 10 may replace defective bit lines on a unit-by-unit basis with a preset number of bit lines. For example, the test device 10 may replace defective bit lines by a 16 bit lines unit, e.g., even when only one bit line is a defective bit line, 16 bit lines including the defective bit line may be replaced with redundancy bit lines. In another embodiment, a unit of bits lines different from 16 (e.g., 8, 32, etc.) may replace a unit having at least one defective bit line.

In order for the test device 10 to detect a defective bit line, data read from memory cells and data programmed in the nonvolatile memory device 100 may be compared with each other. To perform the comparison, the test device 10 may receive readout data from the nonvolatile memory device 100.

The nonvolatile memory device 100 may include the memory cell array 110, a page buffer 120, a defect detector 130 and an input/output circuit 140. The nonvolatile memory device 100 may perform a program operation set in memory cells of the memory cell array 110 based on a test pattern of the test device 10. The nonvolatile memory device 100 may readout data programmed in memory cells and transmit the readout data to the test device 10 based on the test pattern.

The nonvolatile memory device 100 may include defect detector 130 that outputs one defective data DFD at every preset number of bit lines. In one embodiment, the defective data DFD may include a signal representing whether a defective bit line exists among the preset number of bit lines. The defect detector 130 transmits the defective data DFD to the input/output circuit 140, and the input/output circuit 140 transmits the defective data DFD to the test device 10 based on a control signal.

The defect detector 130 may be connected to bit lines BL1~BLn of the memory cell array 110 through the page buffer 120. The defect detector 130 receives readout data which is transmitted through the bit lines BL1~BLn of the memory cell array 110 and then temporarily stored in the page buffer 120. The defect detector 130 may compare a logical state of the readout data to output defective data DFD.

At this time, the defect detector 130 may output one defective data DFD at every preset number of bit lines. In one embodiment, the defective data DFD may be a signal representing whether a defective bit line exists among the preset number of bit lines. For instance, when the defective data DFD is in a logical state of 1, at least one bit line among the preset number of bit lines may be a defective bit line. When the defective data DFD is in a logical state of 0, all the preset number of bit lines may be a normal (e.g., non-defective) bit line.

In one embodiment, the defect detector 130 judges whether a defective line exists in the bit lines BL1~BLn of the memory cell array 110 on a unit-by-unit, or group-by-group, basis relating to the preset number of bit lines unit (hereinafter it is referred to as a replacement group) to output defective data DFD. For example, when the number of bit lines of the memory cell array 110 is 160 and the replacement group is 16, the defect detector 130 may output 10 defective data DFD. Thus, when the test device 10 replaces defective bit lines by one replacement unit including by 16 bit lines, the defect detector 130 outputs 10 defective data DFD.

To detect a defective bit line, the nonvolatile memory device 100 may transmit defective data DFD to the test device 10 only ten times, instead of transmitting readout data to the test device 10 one hundred sixty times. Thus, the number of times of data transmissions for detection of a defective bit line of the nonvolatile memory device 100 is reduced. As a result, test time of the nonvolatile memory device 100 is reduced.

Figure 2:
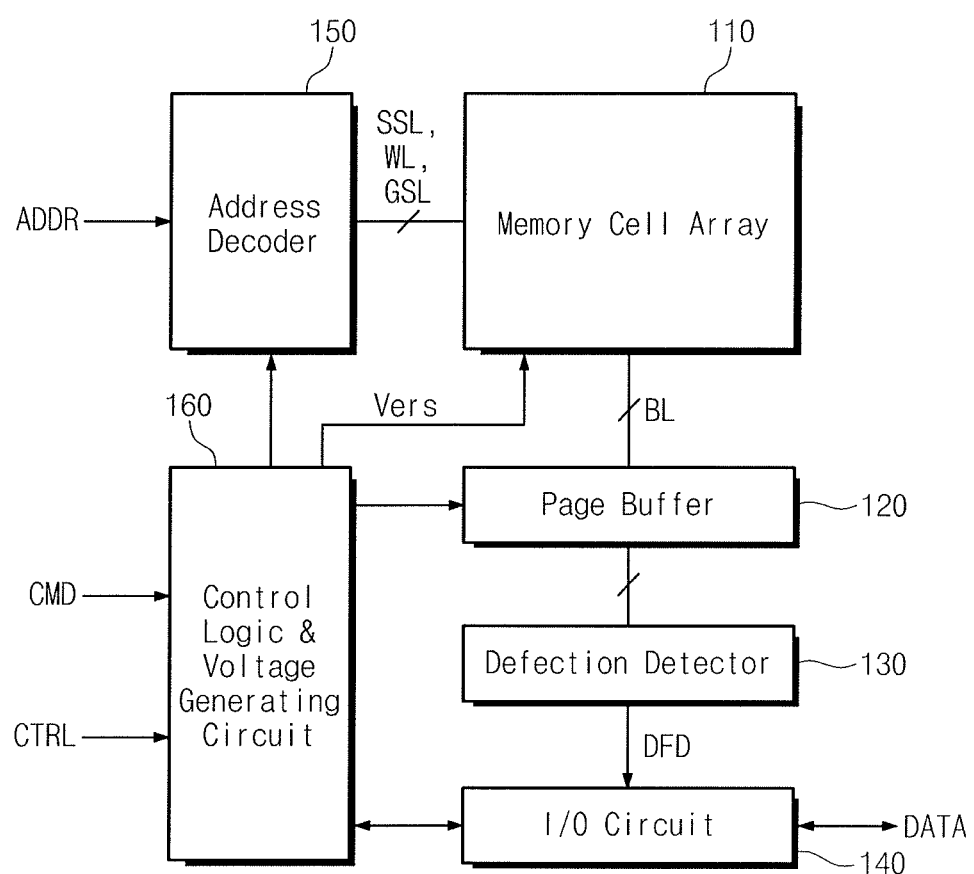
FIG. 2 illustrates an embodiment of a nonvolatile memory device.

FIG. 2 illustrates an embodiment of a nonvolatile memory device 100 which includes a memory cell array 110, a page buffer 120, a defect detector 130, an input/output circuit 140, an address decoder 150, and a control logic & voltage generating circuit 160. The nonvolatile memory device 100 may be connected to the test device 10 (refer, e.g., to FIG. 1) to operate in test mode. When the nonvolatile memory device 100 operates in test mode, the test device 10 may rapidly detect whether bit lines are defective.

The memory cell array 110 includes a plurality of memory blocks, where each memory block includes a plurality of memory cells. The memory cells may be connected to a plurality of word lines WL, respectively. In one non-limiting embodiment, each memory cell may include a single level cell SLC storing 1-bit and a multi level cell MLC storing at least 2-bit. The memory cell array 110 may include a normal area and a redundancy area for replacing defective bit lines included in the normal area.

The address decoder 150 is connected to the memory cell array 110 through a plurality of word lines WL, string select lines SSL, and ground select lines GSL. The address decoder 150 may decode an address ADDR received from the test device 10. The address decoder 150 selects at least one of the word lines WL based on the decoded address ADDR and may control the selected at least one word line.

The control logic & voltage generating circuit 160 receives a command CMD and a control signal CTRL from the test device 10 and may control the address decoder 150, the page buffer 120, and the input/output circuit 140 based on the received signals. For example, based on the command CMD and the control signal CTRL, the control logic & voltage generating circuit 160 may control the address decoder 150, the page buffer 120 and the input/output circuit 140 so that data DATA from the test device 10 is written in memory cell array 110 or data stored in the memory cell array 110 is read out.

The control logic & voltage generating circuit 160 may generate a variety of voltages to operate the nonvolatile memory device 100. For example, the control logic & voltage generating circuit 160 may generate a variety of voltages, e.g., a plurality of program voltages, a plurality of pass voltages, a plurality of select read voltages, a plurality of unselect read voltages, a plurality of erase voltages, and/or a plurality of verification voltages.

The page buffer 120 is connected to the memory cell array 110 through a plurality of bit lines BL1~BLn. The page buffer 120 may control the bit lines BL1~BLn based on data DATA from the input/output circuit 140 according to control of the control logic & voltage generating circuit 160. The page buffer 120 may receive data from the input/output circuit 140 in predetermined units (e.g., page units) or may read data from the memory cell array 110 by predetermined units (e.g., page units). The page buffer 120 may include, for example, one or more data latches for temporarily storing the data read from the memory cell array 110 or the data from input/output circuit 140.

The defect detector 130 receives data read out from memory cells from the page buffer 120 and compares a logical state of the received data to output defective data DFD. The readout data is data transmitted from the memory cells to the page buffer 120 through one or more bit lines. For example, the number of readout data corresponds to the number of bit lines of the memory cell array 110. If a defect exists in a specific bit line, logical states of data programmed in a memory cell connected to a corresponding bit line and data read out from the memory cell to be transmitted to the page buffer 120 may be different from each other.

The defect detector 130 may compare readout data transmitted from the page buffer 120 in a preset group unit to output one defective data DFD at every corresponding group unit. For instance, the defect detector 130 may compare logical states of 16 readout data to output defective data DFD. The group unit may correspond to a replacement group unit by which, in a test operation of the nonvolatile memory device 100, the test device 10 (refer, e.g., to FIG. 1) replaces at least one defective bit line. For example, when test device 10 replaces one or more defective bit lines by one replacement unit constituted by 16 bit lines, the defect detector 130 may compare logical states of 16 readout data to output defective data DFD.

The defect detector 130 may compare logical states of all the readout data transmitted from the page buffer 120 by a preset group unit and output defective data DFD. For example, when 160 readout data is received from the page buffer 120, the defect detector 130 may output one defective data DFD at every 16 readout data. In this case, the defect detector 130 outputs totaled 10 defective data DFD.

For example, when 16 readout data are all in the same logical states, the defect detector 130 may output defective data DFD of logic 0. When any one of the 16 readout data is in a different logical state, the defect detector 130 may output defective data DFD of logic 1, which indicates that at least one bit line among bit lines to which the 16 readout data are transmitted is a defective bit line. The defect detector 130 transmits the defective data DFD to the input/output circuit 140.

The input/output circuit 140 may receive data DATA from the test device 10 (refer, e.g., to FIG. 1) and transmit the received data DATA to the page buffer 120. The input/output circuit 140 may receive data DATA from the page buffer 120 and transmit the received data DATA to the test device 10. The input/output circuit 140 may transmit and receive data DATA to and from the test device 10 in synchronization with a control signal CTRL. When transmitting data to the test device 10, the input/output device 140 may transmit the data DATA to the test device 10 in synchronization with a read enable signal RE, which is the control signal CTRL. At this time, the data DATA being transmitted to the test device 10 may be data corresponding to defective data DFD, which is an output signal of the defect detector 130.

In a test operation performed by the test device 10, the nonvolatile memory device 100 compares a logical state of data, read out from the memory cell array 110 by the preset number of group units, to generate defective data DFD. The defective data DFD may be a signal indicating whether or not bit lines, connected to memory cells from which readout data of a corresponding group is read out, are defective. For example, whether a specific number of bit lines are defective may be indicated by one defective data DFD transmitted to the test device 10, instead of transmitting to the test device 10 data corresponding to the number of bit lines of the memory cell array 110. As a result, test time of the nonvolatile memory device 100 may be reduced.

Figure 3:
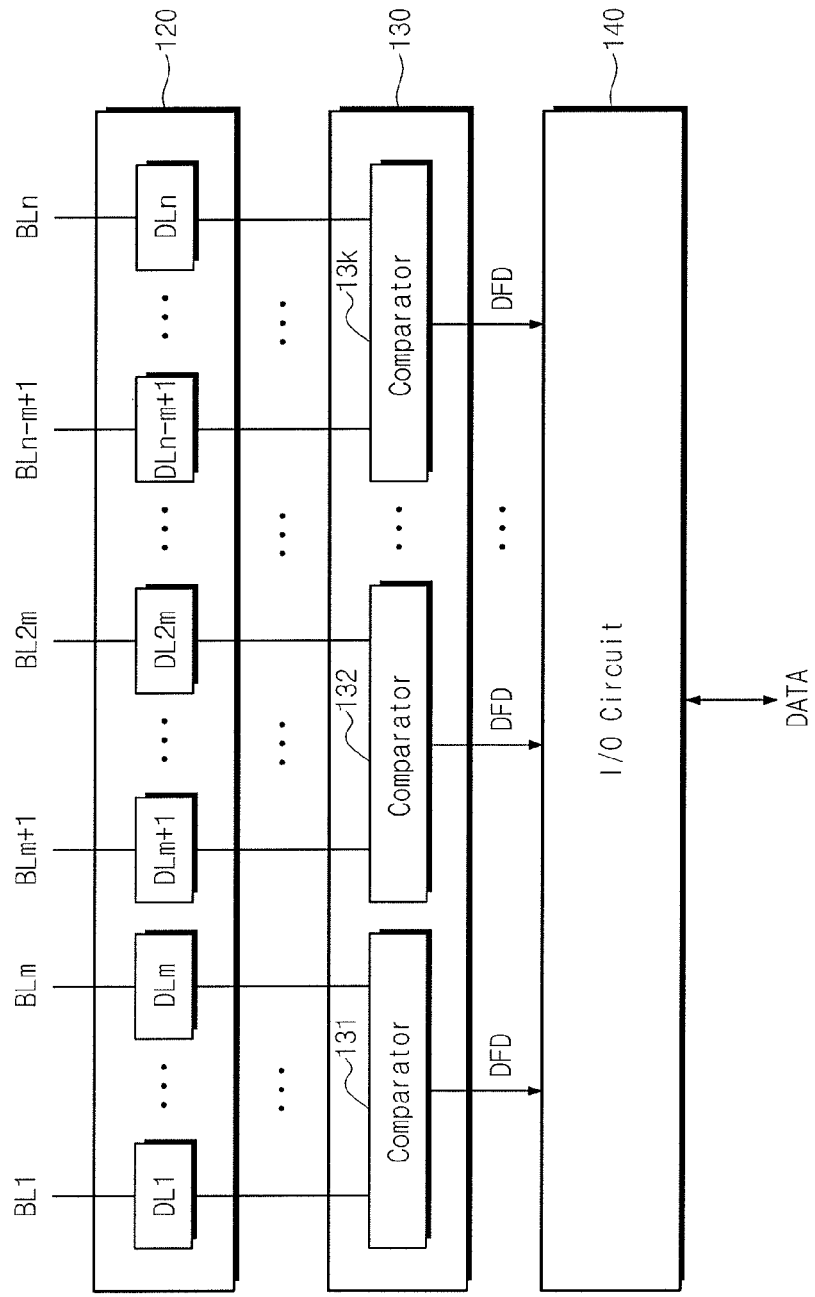
FIG. 3 illustrates an embodiment of a defect detector.

FIG. 3 illustrates an embodiment of a defect detector 130 which includes a plurality of comparators 131~13k. The comparators 131~13k receive readout data stored in data latches DL1~DLn of the page buffer 120 through bit lines BL1~BLn.

Each comparator is connected to a set number of data latches in order to receive readout data. The set number may correspond, for example, to the unit by which the test device 10 replaces defective bit lines of the nonvolatile memory device 100. For example, when the test device 10 is to replace defective bit lines of the nonvolatile memory device 100 by one replacement group constituted by 16 bit lines, the set number of data latches may be 16. Operation of the defect detector 130 of when the number (n) of bit lines of the memory cell array 110 is 160 and the set number is 16 will be described below. In this case, the number (k) of the comparators 131~13k may be 10 for illustration purposes only.

First, data read out from memory cells may be stored in the data latches DL1~DLn of the page buffer 120 based on a read command of the test device 10. The comparator 131 is connected to the data latches DL1~DL16 to receive readout data. The comparator 131 compares logical states of the received readout data to output defective data DFD. For example, when the logical states of the received readout data are all the same, the comparator 131 may output defective data DFD of logic 0.

However, when even one of the logical states of the received readout data is different from the remaining logical states, the comparator 131 may output defective data DFD of logic 1. Thus, logic 0 may be a signal representing that bit lines connected to data latches into which the readout data is input are all normal bit lines. Logic 1 may be a signal representing that at least one bit line, among bit lines connected to data latches into which the readout data is inputted, is a defective bit line.

Using the method described above, the comparators 131~13k output defective data DFD. As described above, when the number of bit lines constituting the memory cell array 110 is 160 and each comparator receives 16 readout data, the defect detector 130 outputs total 10 defective data DFD. Thus, the nonvolatile memory device 100 may transmit only data corresponding to 10 defective data DFD to the test device 10 in order to detect defects of 160 bit lines. As a result, the time taken for the test device 10 to detect defective bit lines and replace the defective bit lines with redundancy bit lines may be reduced. This is because, when the test device 10 replaces the defective bit lines, the defective bit lines are not replaced by individual bit lines (e.g., on a line-by-line basis) but rather a unit of lines including at least one defective bit line is replaced by a replacement group unit constituted by the preset number of bit lines.

Figure 4A:
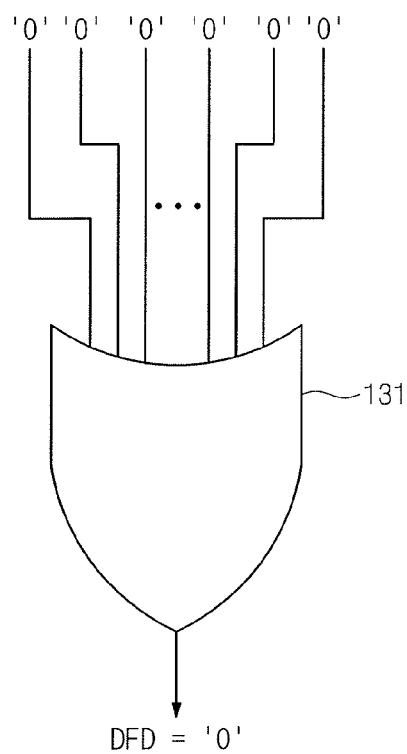
FIGS. 4A and 4B illustrate examples of a comparator.
Figure 4B:
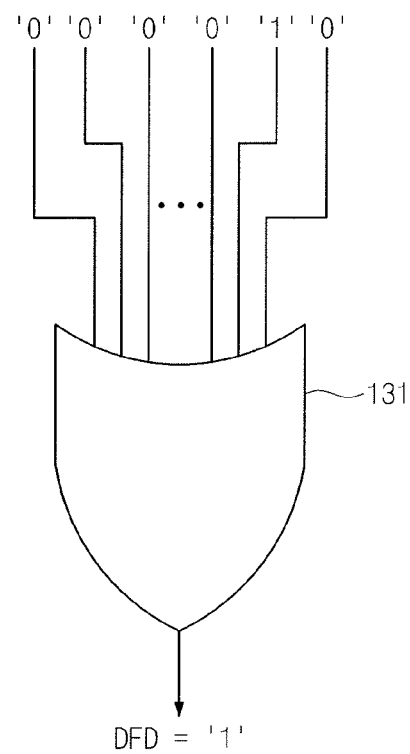

FIGS. 4A and 4B illustrate example operations which may be performed by the comparator of FIG. 3. Referring to FIGS. 4A and 4B, the comparator of FIG. 3 may include, for example, an OR gate. When the logical states of all readout data into the OR gate are all 0, the OR gate outputs defective data DFD of logic 0. When even one of readout data input into the OR gate has logic 1, the OR gate outputs defective data DFD of logic 1. The memory cells of the nonvolatile memory device 100 may all be programmed as logic 0 by a program command of the test device 10.

FIG. 4A illustrates the example where the comparator 131 is embodied by an OR gate and readout data are all in the state of logical 0. Referring to FIG. 4A, data programmed in memory cells by a read command of the test device 10 (refer, e.g., to FIG. 1) may be transmitted to the page buffer 120 (refer e.g., to FIG. 2) through bit lines. As described above, since all memory cells of the memory cell array 110 are programmed as logical 0, if bit lines are normal bit lines, the readout data stored in the data latches may be all in a state of logic 0. When logical 0 is input into all input terminals of the OR gate, the OR gate outputs defective data DFD of logical 0. Thus, the defective data DFD of logical 0 may indicate that corresponding bit lines are all normal bit lines.

FIG. 4B illustrates the case where the comparator 131 includes an OR gate and at least one of the readout data is in a state of logical 1. Referring to FIG. 4A, data programmed in memory cells by a read command of the test device 10 (refer, e.g., to FIG. 1) may be transmitted to the page buffer 120 (refer, e.g., to FIG. 2) through bit lines. As described above, since all memory cells of the memory cell array 110 are programmed as a logical 0, if bit lines are normal bit lines, the readout data stored in the data latches may be all in a state of logical 0. However, when even one bit line is a defective bit line, readout data transmitted through the bit line may have logical 1. When one or more logical 1 values are input into the OR gate, the OR gate outputs defective data DFD of logical 1. Thus, the defective data DFD of logical 1 may indicate that at least one bit line among corresponding bit lines is a defective bit line.

Thus, as illustrated in FIGS. 4A and 4B, the comparator 131 may be embodied by an OR gate which compares logical states of readout data and outputs a logical 0 or 1 based on the comparison to indicate the absence or presence of defective bit lines. In another embodiment, logic different from an OR gate may be used to perform the comparisons described herein.

Figure 5:
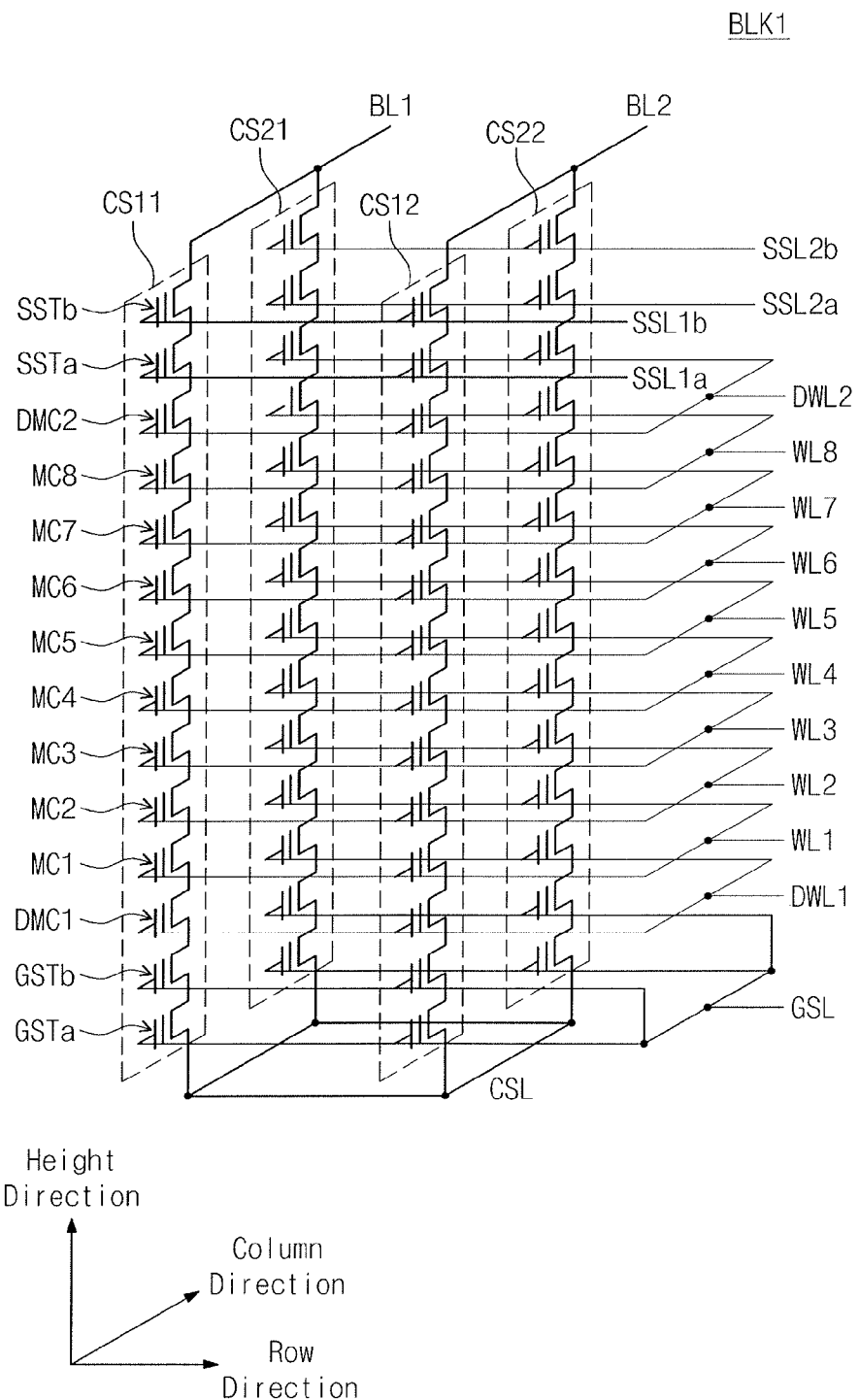
FIG. 5 illustrates an embodiment of a first memory block in a memory cell array.

FIG. 5 illustrates an embodiment of a first memory block BLK1 among memory blocks in the memory cell array of FIG. 2. The memory block BLK1 has a three-dimensional structure. The other memory blocks may have the same or a different structure.

Referring to FIG. 5, the memory block BLK1 includes a plurality of cell strings CS11, CS12, CS21, and CS22 arranged along a row direction and a column direction to form rows and columns. For example, the cell strings CS11 and CS12 may be connected to string select lines SSL1a and SSL1b to form a first row. The cell strings CS21 and CS22 may be connected to string select lines SSL2a and SSL2b to form a second row. The cell strings CS11 and CS21 may be connected to a first bit line BL1 to form a first column. The cell strings CS12 and CS22 may be connected to a second bit line BL2 to form a second column.

Each cell string may include a plurality of transistors. In one embodiment, the transistors include a plurality of string select transistors SSTa and SSTb, a plurality of memory cells MC1~MC8, ground select transistors GSTa and GSTb, and dummy memory cells CMC1 and DMC2. Each transistor in the cell string may be a charge trap flash (CTF) memory cell.

The memory cells MC1~MC8 are serially connected and laminated along a predetermined (e.g., height) direction crossing or perpendicular to a plane formed by the row and column directions. The string select transistors SSTa and SSTb are serially connected to each other and may be between the memory cells MC1~MC8 and the bit line BL. The ground select transistors GSTa and GSTb are serially connected to each other and may be between the memory cells MC1~MC8 and a common source line CSL.

The first dummy memory cell DMC1 may be between the memory cells MC1~MC8 and the ground select transistors GSTa and GSTb. The second dummy memory cell DMC2 may be between the memory cells MC1~MC8 and the string select transistors SSTa and SSTb.

The ground select transistors GSTa and GSTb of the cell strings CS11, CS12, CS21, and CS22 may be connected in common to a ground select line GLS. Ground select transistors of the same row may be connected to the same ground select line. Ground select transistors of different rows may be connected to different ground select lines. For example, the first ground select transistors GSTa of the cell strings CS11 and CS12 of the first row may be connected to a first ground select line, and the first ground select transistors GSTa of the cell strings CS21 and CS22 of the second row may be connected to s second ground select line.

Ground select transistors at the same height or level relative, for example, to a substrate, may be connected to the same ground select line. Ground select transistors at different heights from the substrate may be connected to different ground select lines. For example, the first ground select transistors GSTa of the cell strings CS11, CS12, CS21, and CS22 are connected to the first ground select line, and the second ground select transistors GSTb of the cell strings CS11, CS12, CS21, and CS22 are connected to the second ground select line.

Memory cells at the same height or level relative, for example to the substrate or the ground select transistor (GSTa, GSTb) are connected in common to the same word line. Memory cells at different heights or levels relative, for example, to the substrate or the ground select transistor (GSTa, GSTb) are connected to different word lines. For example, the memory cells MC1~MC8 of the cell strings CS11, CS12, CS21, and CS22 are connected to first through eighth word lines WL1~WL8 in common respectively.

String select transistors of the same row, among the first string select transistors SSTa of the same height or level, are connected to the same string select line. String select transistors of different rows are connected to different string select lines. For example, the first string select transistors SSTa of the cell strings CS11 and CS12 of the first row are connected to a string select line SSL1a in common, and the first string select transistors SSTa of the cell strings CS21 and CS22 of the second row are connected to the string select line SSL2a in common.

Similarly, string select transistors of the same row among the second string select transistors SSTb of the same height or level are connected to the same string select line. String select transistors of different rows are connected to different string select lines. For example, the second string select transistors SSTb of the cell strings CS11 and CS12 of the first row are connected in common to a string select line SSL1b in common, and the second string select transistors SSTb of the cell strings CS21 and CS22 of the second row are connected to the string select line SSL2b in common.

String select transistors of cell strings of the same row may be connected in common to the same string select line. For example, the first and second string select transistors SSTa and SSTb of the cell strings CS11 and CS12 of the first row may be connected in common to the same string select line. The first and second string select transistors SSTa and SSTb of the cell strings CS21 and CS22 of the second row may be connected in common to the same string select line.

Dummy memory cells of the same height or level are connected to the same dummy word line. Dummy memory cells of different heights or levels are connected to different word lines. For example, the first dummy memory cells DMC1 are connected to a first dummy word line DWL1, and the second dummy memory cells DMC2 are connected to a second dummy word line DWL2.

In the first memory block BLK1, read and write operations may be performed in row units. For example, one row of the memory block BLK1 may be selected by the string select lines SSL1a, SSL1b, SSL2a, and SSL2b.

For example, when a turn-on voltage is supplied to the string select lines SSL1a and SSL1b and a turn-off voltage is supplied to the string select lines SSL2a and SSL2b, the cell strings CS11 and CS12 of the first row are connected to the bit lines BL1 and BL2. When a turn-on voltage is supplied to the string select lines SSL2a and SSL2b and a turn-off voltage is supplied to the string select lines SSL1a and SSL1b, the cell strings CS21 and CS22 of the second row are connected to the bit lines BL1 and BL2. Memory cells of the same height or level, among memory cells of a cell string of a row driven by driving a word line, are selected. Read and write operations may be performed in the selected memory cells. The selected memory cells may form a physical page unit.

In the first memory block BLK1, an erase operation may be performed by a memory block unit or a sub block unit. When an erase operation is performed by a memory block unit, all memory cells MC of the first memory block BLK1 may be erased at the same time according to one erase request. When an erase operation is performed by a sub block unit, some memory cells MC of the first memory block BLK1 are erased at the same time according to an erase request and the remaining memory cells may be erase-prohibited. A low voltage (e.g., a ground voltage) may be supplied to a word line connected to memory cells being erased and a word line connected to the erase-prohibited memory cells may be floated.

The memory block BLK1 in FIG. 5 is illustrative. The number of cell strings may be more or less in another embodiment, and the number of rows and columns constituted by cell strings may be more or less in another embodiment, depending, for example, on the number of the cell strings. The number of cell transistors GST, MC, DMC, and SST of the first memory block BLK1 may be more or less and/or the height or level of the first memory block BLK1 may be different in another embodiment depending, for example, on the number of the cell transistors. Also, the number of lines GSL, WL, DWL and SSL connected to cell transistors may be different depending, for example, on the number of the cell transistors.

In one embodiment, a three dimensional (3D) memory array is provided. The 3D memory array may be monolithically formed in one or more physical levels of arrays of memory cells having an active area above a silicon substrate and circuitry associated with the operation of those memory cells. The associated circuitry may be above or within the substrate. The term "monolithic" may correspond to the case where layers of each level of the array are directly deposited on the layers of each underlying level of the array.

In one embodiment, the 3D memory array includes vertical NAND strings that are vertically oriented, such that at least one memory cell is located over another memory cell. The at least one memory cell may include a charge trap layer. Each vertical NAND string may include at least one select transistor over memory cells. The at least one select transistor may have the same structure as memory cells and may be formed monolithically together with the memory cells.

The following patent documents, which are hereby incorporated by reference, describe example configurations for three-dimensional memory arrays, in which the three-dimensional memory array is configured as a plurality of levels, which word lines and/or bit lines shared between levels: U.S. Pat. Nos. 7,679,133; 8,553,466; 8,654,587; 8,559,235; and US Pat. Pub. No. 2011/0233648.

Figure 6:
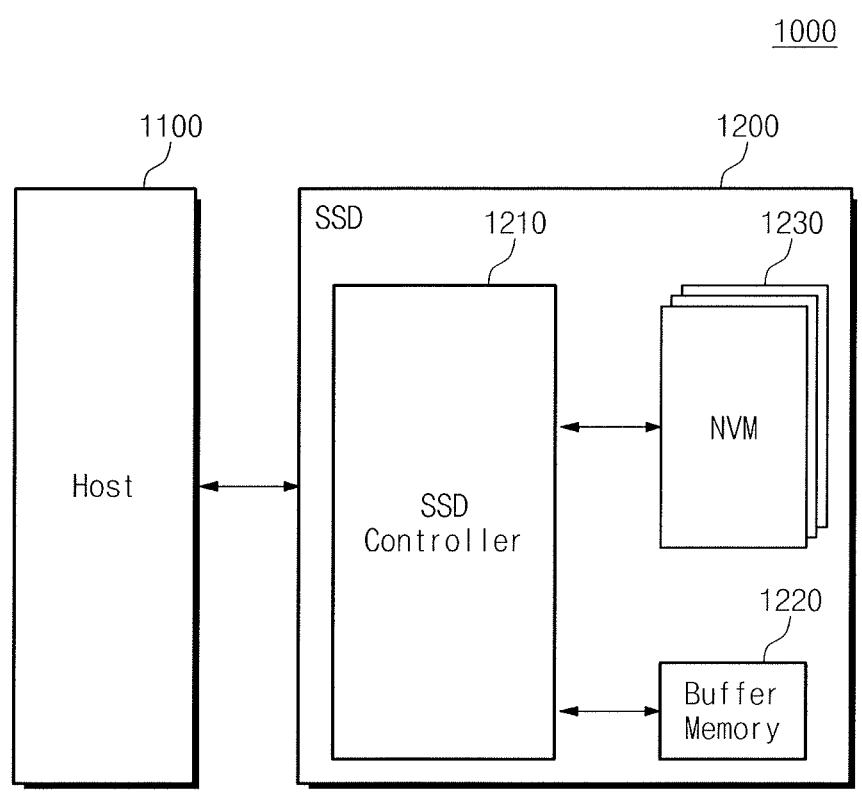
FIG. 6 illustrates an embodiment of a user device.

FIG. 6 illustrates an embodiment of a user device 1000 including a solid state disk (SSD) corresponding to a nonvolatile memory device. Referring to FIG. 6, the user device 1000 includes a host 1100 and a SSD 1200. The SSD 1200 includes a SSD controller 1210, a buffer memory 1220, and a nonvolatile memory device 1230.

The SSD controller 1210 provides a physical connection between the host 1100 and the SSD 1200. For example, the SSD controller 1210 corresponds to a bus format of the host 1100 to provide an interface with the SSD 1200. The SSD controller 1210 decodes a command from the host 1100. According to a decoded result, the SSD controller 1210 accesses the nonvolatile memory device 1230. Examples of types of the bus format of the host 1100 include a USB (universal serial bus), a SCSI (small computer system interface), a PCI express, a ATA, a PATA (parallel ATA), a SATA (serial ATA), a SAS (serial attached SCSI), etc.

Write data from the host 1100 or data read from the nonvolatile memory device 1230 may be temporarily stored in the buffer memory 1220. When data in the nonvolatile memory device 1230 is cached when a read operation is requested by the host 1100, the buffer memory 1220 may support a cache function of directly providing the cached data to the host 1100. A data transmission speed by the bus format (e.g., SATA or SAS) of the host 1100 is much faster than a transmission speed of a memory channel of the SSD 1200. Thus, when the interface speed of the host 1100 is far higher (e.g., above a predetermined threshold level), performance degradation caused by a speed difference may be reduced or minimized by providing large capacity buffer memory 1220.

The buffer memory 1220 may be provided by a SDRAM (synchronous DRAM) to provide a sufficient buffering in the SSD 1200 when used as a large capacity auxiliary memory device. However, the buffer memory 1220 for a different purpose in another embodiment.

The nonvolatile memory device 1230 is provided as a storage medium of the SSD 1200. For example, the nonvolatile memory device 1230 may be provided as a NAND-type flash memory having a high storage capacity. The nonvolatile memory device 1230 may include a plurality of memory devices. In this case, each memory device may be connected to the SSD controller 1210 by a channel unit. In the current embodiment, the nonvolatile memory device 1230 as a storage medium is a NAND-type flash memory. The nonvolatile memory device 1230 may be another type of nonvolatile memory devices in another embodiment. Examples include a PRAM, a MRAM, a ReRAM, a FRAM, a NOR flash memory. In one embodiment, a memory system may include different kinds of memory devices.

The nonvolatile memory device 1230 may include the defect detector 130 (refer, e.g., to FIG. 2) described above. The nonvolatile memory device 1230 may detect a defective bit line at high speed and, thereby, test operation time of the nonvolatile memory device 1230 may be reduced.

Figure 7:
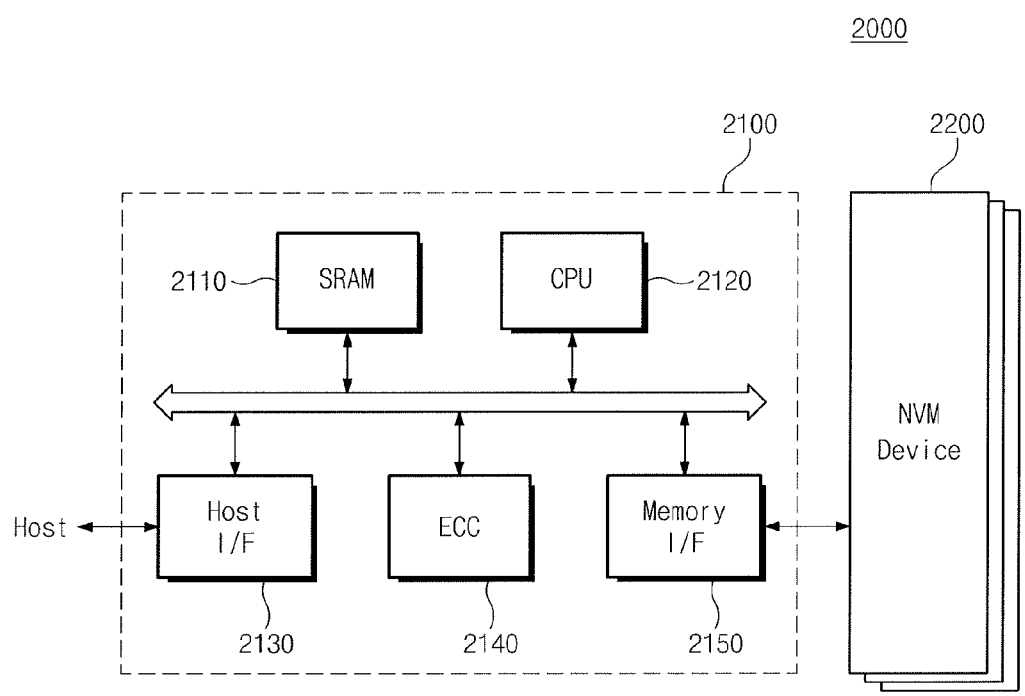
FIG. 7 illustrates an embodiment of a storage device.

FIG. 7 illustrates an embodiment of a storage device 2000 including a nonvolatile memory device 2200, which may correspond to any of the aforementioned embodiments.

Referring to FIG. 7, the storage device 2000 may include a memory controller 2100 and a nonvolatile memory device 2200. The nonvolatile memory device 2200 may correspond to nonvolatile memory device 2200 of FIG. 2. The nonvolatile memory device 2200 includes the defect detector 130 of FIG. 2 and may detect a defective bit line at high speed according to an operation of the defect detector 130. The memory controller 2100 may control the nonvolatile memory device 2200.

An SRAM 2110 may be used as a working memory of a CPU 2120. A host interface 2130 may include data exchange protocols of a host connected to the storage device 2000. An error correction circuit 2140 in the memory controller 2100 may detect and correct error in data read from the nonvolatile memory device 2200. The CPU 2120 may perform an overall control operation for a data exchange of the memory controller 2100. The storage device 2000 may include a ROM or other storage area for storing code data for interfacing with the host.

The memory controller 2100 may communicate with an external device (for example, host) through one or more protocols such as USB, MMC, PCI-E, SAS, SATA, PATA, SCSI, ESDI, and IDE.

The storage device 2000 may be applied to various devices, such but not limited to a computer, an ultra mobile PC (UMPC), a workstation, a net-book, a personal digital assistants (PDA), a portable computer, a web tablet, a tablet computer, a wireless phone, a mobile phone, a smart phone, a digital camera, a digital audio recorder, a digital audio player, a digital picture recorder, a digital picture player, a digital video recorder, a digital video player, a device that may transmit and receive information in a wireless environment, and one of various electronic devices constituting a home network.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The test devices, control logic, detectors, comparators, and other processing features of the embodiments described herein may be implemented in logic which, for example, may include hardware, software, or both. When implemented at least partially in hardware, the test devices, control logic, detectors, comparators, and other processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the test devices, control logic, detectors, comparators, and other processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

In accordance with one or more of the aforementioned embodiments, a nonvolatile memory device may detect a defective bit line at high speed. Also, a test system or device for a nonvolatile memory device may reduce a test operation time.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the embodiments set forth in the claims.

What is claimed is:

1. A nonvolatile memory device, comprising:
   a memory cell array;
   a page buffer connected to bit lines of the memory cell array;
   a defect detector to:
   receive readout data for a group including a first number of the bit lines from the page buffer, the first number of the bit lines being less than all of the bit lines of the memory cell array and the readout data having a number of bits corresponding to the first number;
   compare logical states of the readout data to each other;
   output first data with a first logical state when the logical states of the readout data are not identical to each other, the first data indicative of a defect; and
   output second data with a second logical state when the logical states of the readout data are identical to each other, the second data indicative of no defect, wherein the logical states of the readout data correspond to respective ones of the first number of the bit lines in the group and the first data indicates that at least one bit line in the group is defective, wherein each of the first data and the second data has a number of bits less than the first number of the bits lines in the group; and
   an input/output circuit to output the first data or the second data based on a control signal.

2. The nonvolatile memory device as claimed in claim 1, wherein the readout data is test data and the defect is a defective bit line.

3. The nonvolatile memory device as claimed in claim 1, wherein: the defect detector includes a comparator which is connected to the bit lines in the group and compares the logical states of the readout data.

4. The nonvolatile memory device as claimed in claim 3, wherein the first data with the first logical state indicates that at least one of the first number of the bit lines in the group is a defective bit line.

5. The nonvolatile memory device as claimed in claim 3, wherein the second data with the second logical state indicates that the first number of the bit lines in the group are all non-defective bit lines.

6. The nonvolatile memory device as claimed in claim 1, wherein the first number of the bit lines in the group correspond to column units by which a defective bit line is repaired in a test operation of the nonvolatile memory device.

7. The nonvolatile memory device as claimed in claim 1, wherein the memory cell array includes a three-dimensional memory cell array.

8. A test system, comprising:
   a nonvolatile memory device including:
   a defect detector to receive readout data from a page buffer connected to bit lines of a memory cell array and to perform a logical operation based on the readout data for a group including a first number of the bit lines, the first number of the bit lines being less than all of the bit lines of the memory cell array and the readout data having a number of bits corresponding to the first number, and
   an input/output circuit to output first data or second data based on a read enable signal; and
   a test device to receive the first data or second data from the nonvolatile memory device, to detect one or more defective bit lines based on the first data or the second data, and to perform a repair operation which includes replacing the one or more defective bit lines with redundancy bit lines,
   wherein the defect detector compares logical states of the readout data to each other, outputs the first data with a first logical state when the logical states of the readout data are not identical to each other, and outputs the second data with a second logical state when the logical states of the readout data are identical to each other, the first data indicative of a defect and the second data indicative of no defect, wherein each of the logical states of the readout data corresponds to each of the first number of bit lines of the group, and wherein the data indicates that at least one bit line of the first number of bit lines in the group is defective.

9. The test system as claimed in claim 8, wherein:
   the defect detector includes a comparator which is connected to the first number of bit lines in the group and is to compare the logical states of the readout data.

10. The test system as claimed in claim 9, wherein the second data with the second logical state indicates that the first number of bit lines in the group are all non-defective bit lines.

11. The test system as claimed in claim 9, wherein the first data with the first logical state indicates that at least one of the first number of bit lines in the group is a defective bit line.

12. The test system as claimed in claim 11, wherein the test device is to replace all bit lines that transmitted readout data to the corresponding one of the comparators with redundancy bit lines based on the first data.

13. The test system as claimed in claim 11, wherein the first number of bit lines in the group are column units by which the test device repairs the one or more defective bit lines of the nonvolatile memory device.

14. The test system as claimed in claim 8, wherein:
the memory cell array is a three-dimensional memory cell array, and
the three-dimensional memory cell array has one or more physical levels of memory cells with active regions monolithically provided on a silicon substrate.

15. The test system as claimed in claim 8, wherein the readout data is provided to detect the one or more defective bit lines.

* * * * *